United States Patent
Dizon et al.

(10) Patent No.: US 6,192,092 B1
(45) Date of Patent: Feb. 20, 2001

(54) METHOD AND APPARATUS FOR CLOCK SKEW COMPENSATION

(75) Inventors: Rommel O. Dizon; Thomas D. Fletcher; Javed S. Barkatullah, all of Portland; Eitan Rosen, Aloha, all of OR (US)

(73) Assignee: Intel Corp., Santa Clara, CA (US)

( * ) Notice: Under 35 U.S.C. 154(b), the term of this patent shall be extended for 0 days.

(21) Appl. No.: 09/094,666

(22) Filed: Jun. 15, 1998

(51) Int. Cl.[7] .............................. H04L 7/00; H04L 25/00; H04L 25/40
(52) U.S. Cl. ........................... 375/371; 713/503; 714/700
(58) Field of Search ................................. 375/354, 355, 375/356, 362, 371, 376, 373; 326/93; 713/503, 500, 600, 401, 501; 714/700; 716/6

(56) References Cited

U.S. PATENT DOCUMENTS

| | | | |
|---|---|---|---|
| 4,992,676 | * | 2/1991 | Gerosa et al. ........................... 326/27 |
| 5,062,124 | * | 10/1991 | Hayashi et al. ....................... 375/356 |
| 5,087,829 | * | 2/1992 | Ishibashi et al. ..................... 327/152 |
| 5,146,306 | * | 9/1992 | Ferry et al. ........................... 257/368 |
| 5,293,626 | * | 3/1994 | Priest et al. ........................... 713/401 |
| 5,374,904 | * | 12/1994 | Ishibashi ................................ 331/17 |
| 5,457,429 | * | 10/1995 | Ogawa et al. .......................... 331/57 |
| 5,465,347 | * | 11/1995 | Chao et al. ........................... 713/401 |
| 5,495,195 | * | 2/1996 | Fontana et al. ....................... 327/108 |
| 5,548,249 | * | 8/1996 | Sumita et al. ......................... 331/1 A |
| 5,570,045 | * | 10/1996 | Erdal et al. ............................. 326/93 |
| 5,572,557 | * | 11/1996 | Aoki ..................................... 375/376 |
| 5,610,548 | * | 3/1997 | Masleid ................................ 327/374 |
| 5,652,530 | * | 7/1997 | Ashuri .................................... 326/93 |
| 5,790,839 | * | 8/1998 | Luk et al. ............................. 713/501 |
| 5,815,540 | * | 9/1998 | Aoki ..................................... 375/374 |
| 5,852,640 | * | 12/1998 | Kliza et al. ........................... 375/356 |
| 5,870,445 | * | 2/1999 | Farwell ................................ 375/371 |
| 6,002,282 | * | 12/1999 | Alfke ................................... 327/165 |

* cited by examiner

*Primary Examiner*—Stephen Chin
*Assistant Examiner*—Lenny Jiang
(74) *Attorney, Agent, or Firm*—Kenyon & Kenyon

(57) ABSTRACT

A method and apparatus to compensate for skew in a processor clock signal. A first clock signal at a first location in the processor is compared with a reference clock signal. The first clock signal is corrected based on the results of this comparison with the reference clock signal. The clock signal may be corrected by using a programmable delay compensator. A second clock signal at a second location in the processor may be compared with the corrected first clock signal and the second clock signal may be corrected based on the results of the comparison. The compensators may be permanently programmed as required using fuses associated with compensator control bits.

18 Claims, 7 Drawing Sheets

METHOD AND APPARATUS FOR CLOCK SKEW COMPENSATION

FIELD

The present invention relates to clock signals. More particularly, the present invention relates to a method and apparatus to compensate for skew in a clock signal.

BACKGROUND

A processor comprises an integrated circuit, or chip, with a large number of elements that perform various logical functions, such as mathematical operations. Within the processor, a clock signal, also known as a "global" clock signal, is used to synchronize data operations performed by elements positioned at different locations on the chip. For example, an element at one location may indicate that information will be available in an internal register during the next global clock cycle. By using the same global clock signal, an element at another location may read the information from the register at the appropriate time. As processor speed has increased, the frequency of the processor's global clock signal has also increased. Clock signals operating at a frequency of 300 million cycles per second (300 MHz) are now common, and will likely increase in the future.

The performance of a processor is based, at least in part, on the synchronization of the global clock signal throughout the chip. For example, it is desirable that information stored in a register is not read before the information has been correctly updated. Moreover, waiting too long before reading the information will usually slow down the operation of the processor. Thus, it is desirable to have the global clock signal arrive at different locations, or destinations, as close to simultaneously as possible.

With the increase in global clock frequency, however, clock inaccuracy has become a large problem in processor design. Clock inaccuracy results in one clock edge not arriving at a sampling point at its nominal time, measured relative to another clock edge. One type of clock inaccuracy is commonly referred to as clock "skew." Consider, for example, two clock signals A and B generated from a single input signal, as shown in FIG. 1A. As can be seen, both paths have an equal number of inverters 10 which should nominally cause the input clock signal to experience a substantially equal delay, $T_0$, along both paths. Suppose, however, that the two paths are laid out on two distant locations on the chip. Assume also that the inverters 10 in path B are laid out next to large bus drivers with high activity factors, so that the supply voltage is lower than that for the devices in path A, which neighbor only small gates with low activity factors. In addition, assume that the channel lengths in path B are actually longer than expected because of some optical defects in the lens used to create the chip, or for other reasons, while the lengths in path A are unaffected. As shown in FIG. 1B, these factors will cause the delay through path B, $T_B$, to be longer than the designed nominal $T_0$. Similarly, the delay through path A, $T_A$, will be shorter than $T_0$. The difference between the two clock signals, or "skew," is also shown in FIG. 1B.

A number of factors may cause the global clock signal in a processor to be skewed at different locations on the chip. For example, variations in the effective channel length of devices across the chip may occur because of in-die variations resulting from lens distortion, wafer planarity or stepper accuracy. Local effects, like device proximity, may also result in variations in channel length. Supply voltage variations across the chip may likewise cause skew, depending on the power grid design and proximity to high activity or large devices. Moreover, Inter-Layer Dielectric (ILD) thickness variation, causing variations in interconnect capacitance, and signal coupling to neighboring lines, may result in delay variation. Also, a design error, such as a mistake when modeling a portion of a circuit, may also contribute to skew.

Several methods of reducing global clock skew are well-known. For example, designers strive to reduce the part of the path that is different between two clock signals. Because each portion, or "stage," which is different may contribute to the clock skew, reducing the number of stages which are different may reduce the clock inaccuracy. Clocks which are logically the same may also be tied together when they are physically close, and a common node is no more than two or three stages back. Additionally, attempts have been made to reduce signal coupling to clock lines, but this generally involves increased line spacing or the insertion of shielding wires. All of these solutions have become less effective with the increase in processor clock frequency. Moreover, the methods have become more difficult because the number of elements in a single processor has increased dramatically over the years.

In view of the foregoing, a need exists for a method and apparatus for deskewing a clock signal to improve synchronization within a processor, and solving the other problems discussed above.

SUMMARY

In accordance with an embodiment of the present invention, a distributed clock signal at a first location in a processor is compared with a reference clock signal. The distributed clock signal is corrected based on the results of the comparison with the reference clock signal.

DETAILED DESCRIPTION

An embodiment of the present invention is directed to a method and apparatus to compensate for skew in a clock signal. According to an embodiment of the present invention, global clock deskewing is achieved using programmable delay buffers, or compensators, at the destination end of the global clock distribution network. In this embodiment, after a chip is fabricated, a global clock signal is tested at its destination. Based on the results of this test, a programmable delay buffer is permanently configured, using fuses, to correct the clock signal.

Figure 1A:
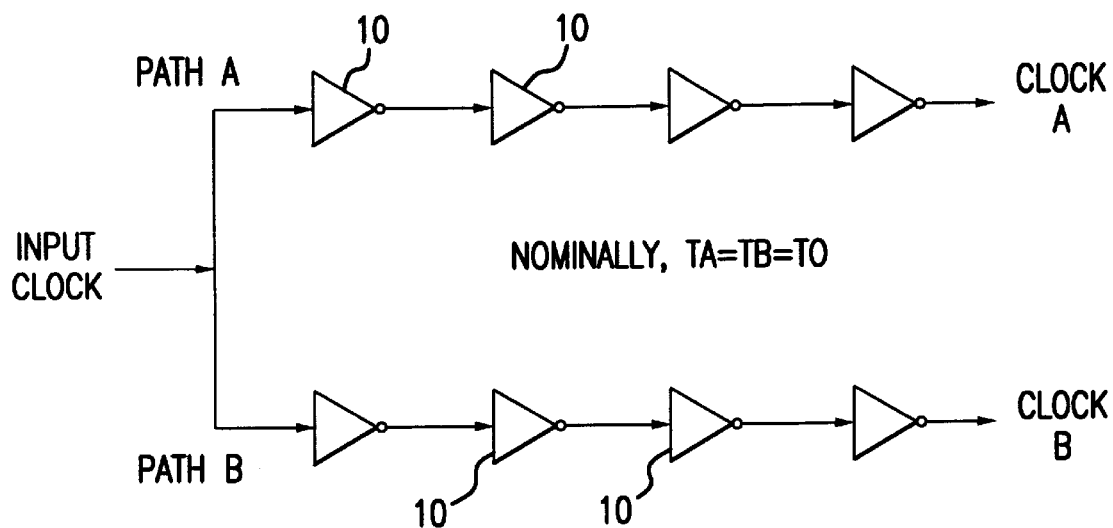
FIG. 1A includes a block diagram of known clock circuit paths.
Figure 1B:
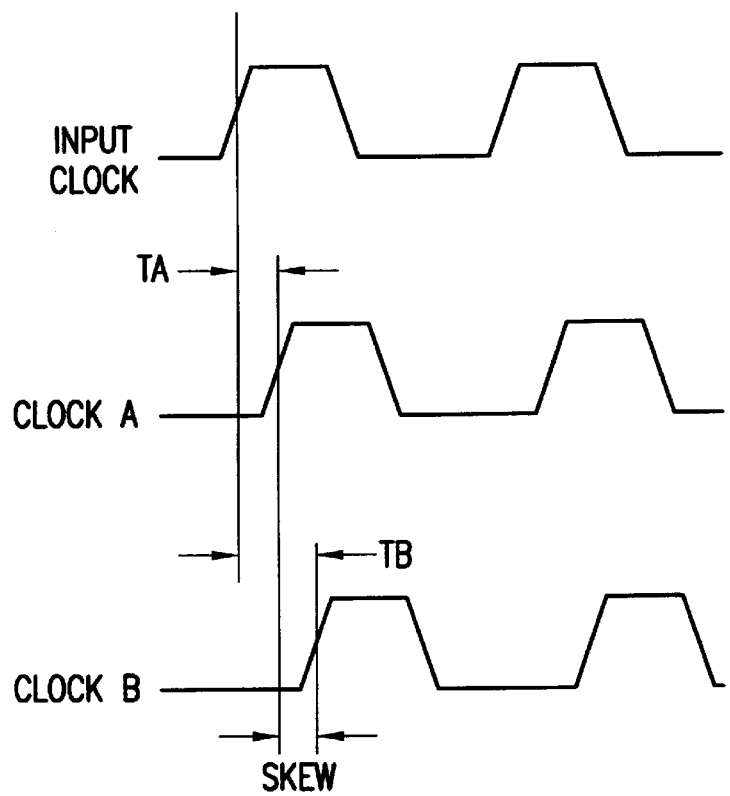
FIG. 1B includes timing diagrams illustrating clock skew in the clock circuit paths.
Figure 2:
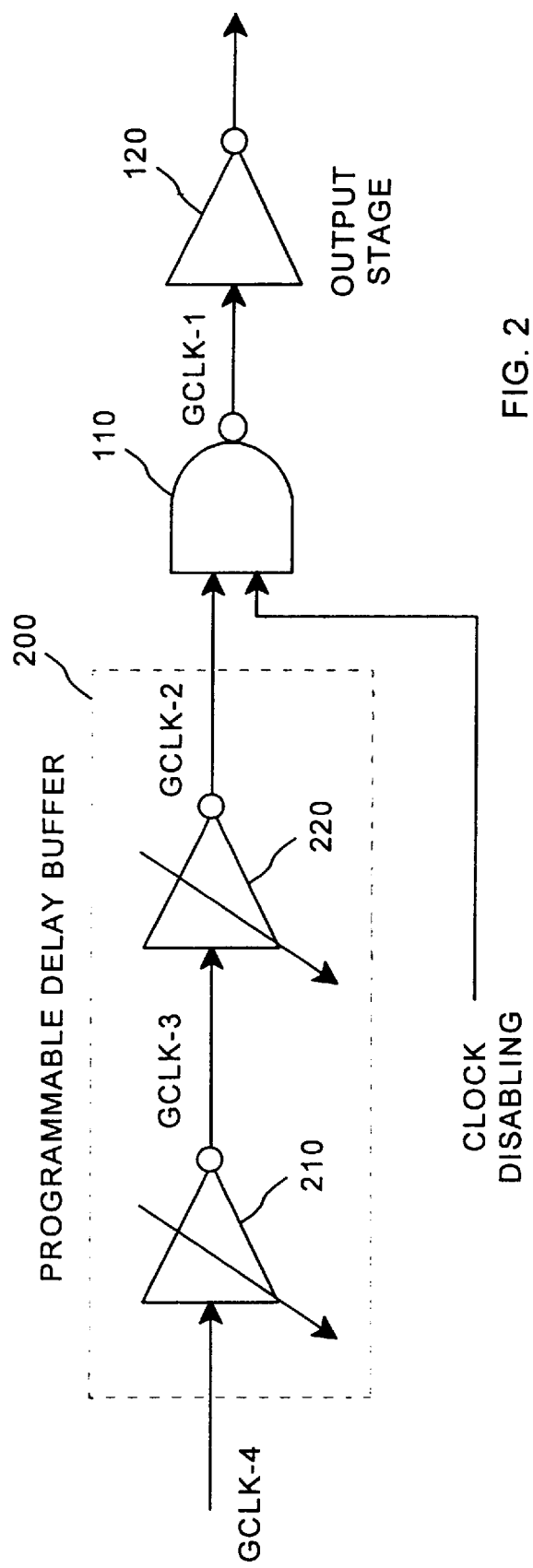
FIG. 2 is a block diagram of deskewing circuitry logic according to an embodiment of the present invention.

Referring now in detail to the drawings wherein like parts are designated by like reference numerals throughout, FIG. 2 shows a block diagram of deskewing circuitry logic according to an embodiment of the present invention. The deskewing circuitry includes a programmable delay buffer 200, or "compensator" that compensates for skew in a signal, comprising two variable delay inverters 210, 220. The circuit also includes a NAND gate 110 for clock disabling/enabling and a normal inverter 120 acting as an output stage. An "uncorrected," or skewed, clock signal GCLK-4 passes through the two variable delay inverters 210, 220, resulting in a "corrected," or deskewed, clock signal GCLK-2. The first variable delay inverter 210 slows down, or speeds up, the rising edge of the GCLK-4 signal to produce a GCLK-3 signal. Putting the two variable delay inverters 210, 220 back-to-back allows control of both edges. The first variable delay inverter 210 adjusts the rising edge and the second variable delay inverter 220 adjusts the falling edge. Normally the rising and falling edge delays will be controlled together, because both will experience the same skewing. Note, however, that the rising and falling edges could be separately adjusted to tune the duty cycle of the clock signal if desired. The NAND gate 110 disables the GCLK-1 output based on a clock disabling input.

Figure 3:
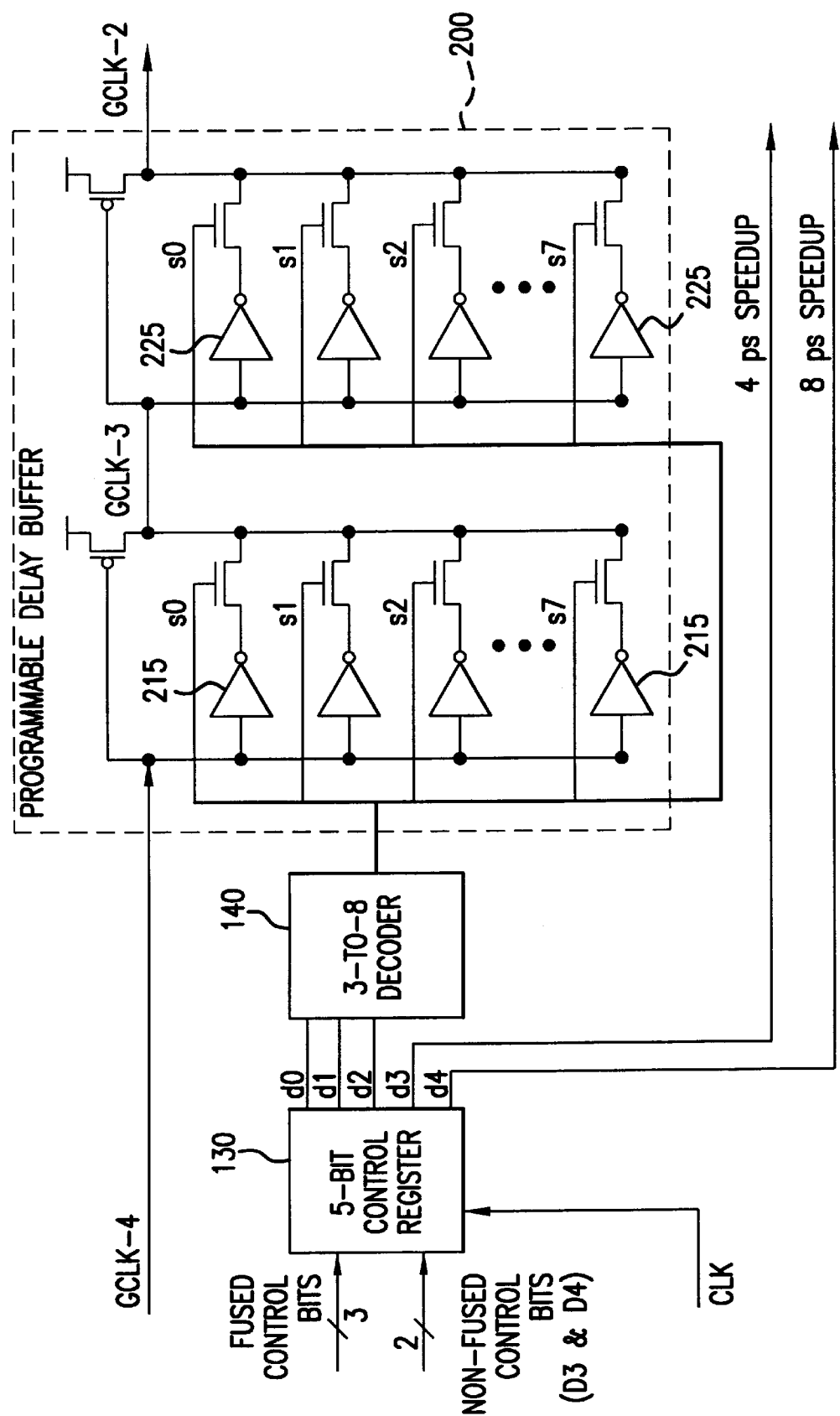
FIG. 3 is a block diagram of deskewing circuitry according to an embodiment of the present invention, including a more detailed view of the programmable delay buffer shown in FIG. 2.

FIG. 3 is a block diagram of deskewing circuitry according to one embodiment of the present invention, including a more detailed view of the programmable delay buffer 200 shown in FIG. 2. A 5-bit control register 130 and a 3-to-8 decoder 140 are used to decode programmed control bits. Three of the output bits, namely d0, d1 and d2, from the 5-bit control register 130 are input to the 3-to 8-decoder 140 to correct the global clock signal as desired. The other two output bits, d3 and d4, serve as 4 picosecond (ps) and 8 ps speedup signals, as will be explained. When a compensator is in its slowest setting, that is the control bits are "000," one of the pull-down paths labeled s0 to s7 associated with the inverters 215, 225 in the programmable delay buffer 200 is open. The remaining control bit patterns open up additional pull-down paths until the fastest setting, where the control bits equal "111," is reached. In this case, all of the pull-down paths in the programmable delay buffer 200 are open. The fastest setting speeds up the GCLK-4 signal a maximum amount to generate GCLK-2. Note that this is only one embodiment of the present invention, and other circuits may be used to correct the clock signal.

According to an embodiment of the present invention, the delay compensator may delay the domain clock by up to 110 ps in steps of approximately 16 ps. The control for the delay is stored in a 3-bit control register (not shown in FIG. 3). Normally, the control register for the compensators will be loaded at power-up from default delay patterns programmed with fuses (not shown in FIG. 3). In this embodiment, the default delay programming may always be overridden by re-programming the control register. One method of selecting an appropriate default delay is to test and program each chip to achieve the fastest speed when the chip is manufactured. While this method would produce the highest yield, it may be unacceptable in terms of testing overhead, because every chip would have to be individually tested. Another method is to characterize the design once in early production and use the same optimal delay "recipe" for all chips. This may not be the optimum solution because the recipe that produces the best result for one chip may not produce satisfactory results for all chips. As another option, a handful of delay recipes could be created, such as one for each lens used to produce the chips, and the appropriate recipe could be applied to each chip. This may be a good compromise between testing overhead and yield.

When an appropriate recipe is selected, the fuses may be burnt for the default delay programming after the processor is fabricated. There are an additional two control bits D3, D4 which, by controlling the signals d3 and d4, may delay the leading edge of the domain clock by steps of 4 ps. As explained with respect to FIG. 6, these two bits D3, D4 are used during the search for the deskewing recipe in order to reduce accumulated error. These bits default to "0," and are not controlled by associated fuses.

Figure 4:
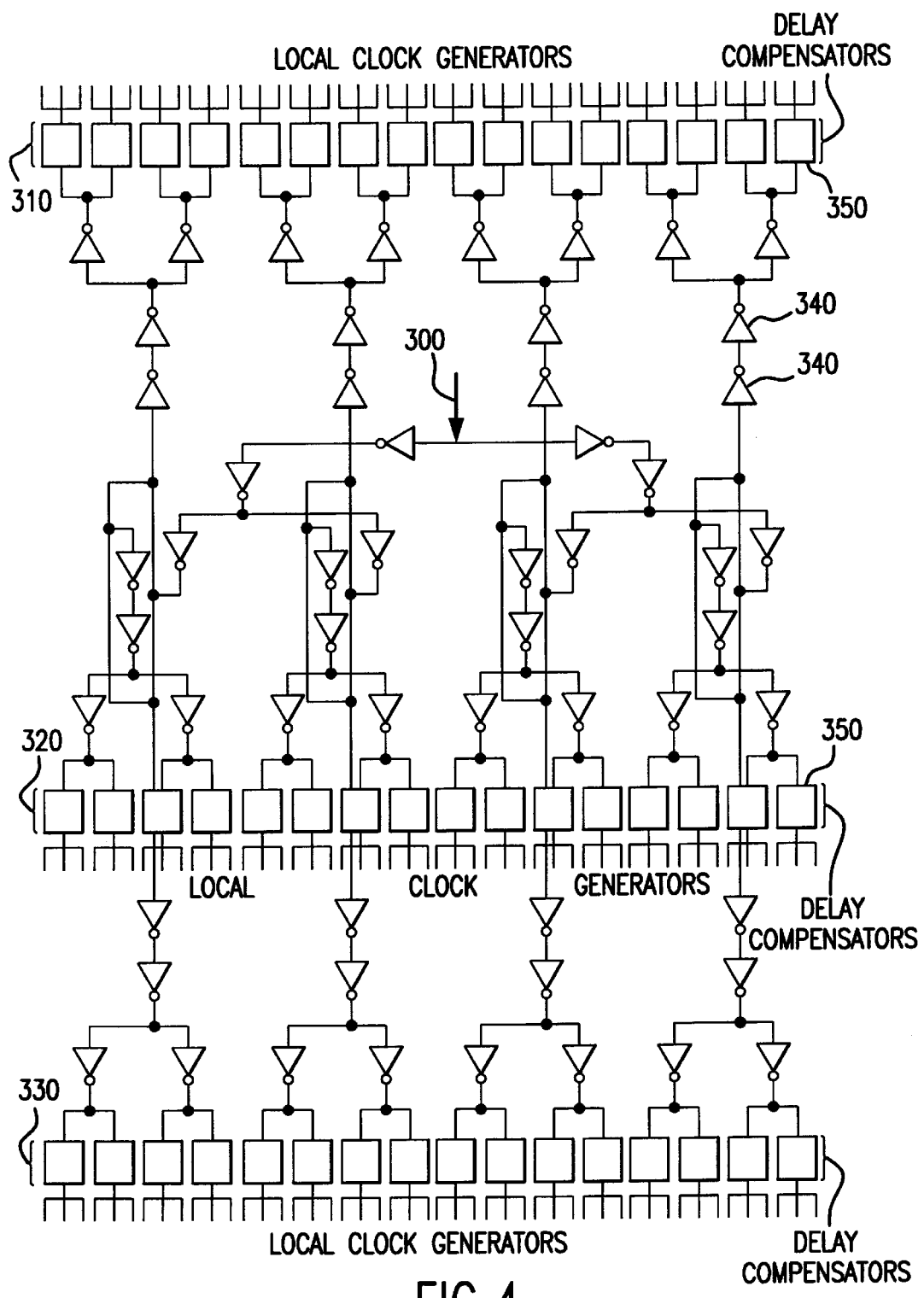
FIG. 4 illustrates the distribution of a global clock signal according to an embodiment of the present invention.

Because the global clock signal is distributed to many different locations on a chip, a number of delay compensators may be used to separately deskew the clock signal. FIG. 4 shows 48 programmable delay compensators 350 located at the destination end of the global clock distribution tree. The compensators 350 are grouped into a top horizontal line or "spine" 310, a center spine 320 and a bottom spine 330, based on their physical location in the chip. Each spine includes global clock buffers, programmable delay compensators 350, and phase detectors (not shown in FIG. 4). The output signals of the delay compensators 350 are routed to unit local clock generators (also not shown in FIG. 4) to generate local, or "domain" clock signals.

After the global clock signal is generated by a Phase Locked Loop (PLL), it enters the clock distribution network at, for example, location 300. If desired, the location may be selected approximately at the center of the distribution in order to reduce as much as possible the amount of clock skew, such as at the center point of the center spine 320. The various inverters 340, buffers and wiring used to route the clock signal throughout the chip distort the relative timing of the clock signal, and the amount of distortion will vary based on differences in, for example, manufacturing plants, wafers and individual processors. As will be explained with respect to FIG. 5, the final stage of the global clock network uses the separate programmable delay compensators 350 to skew or deskew the domain clocks relative to one another using delay control bits.

Figure 5:
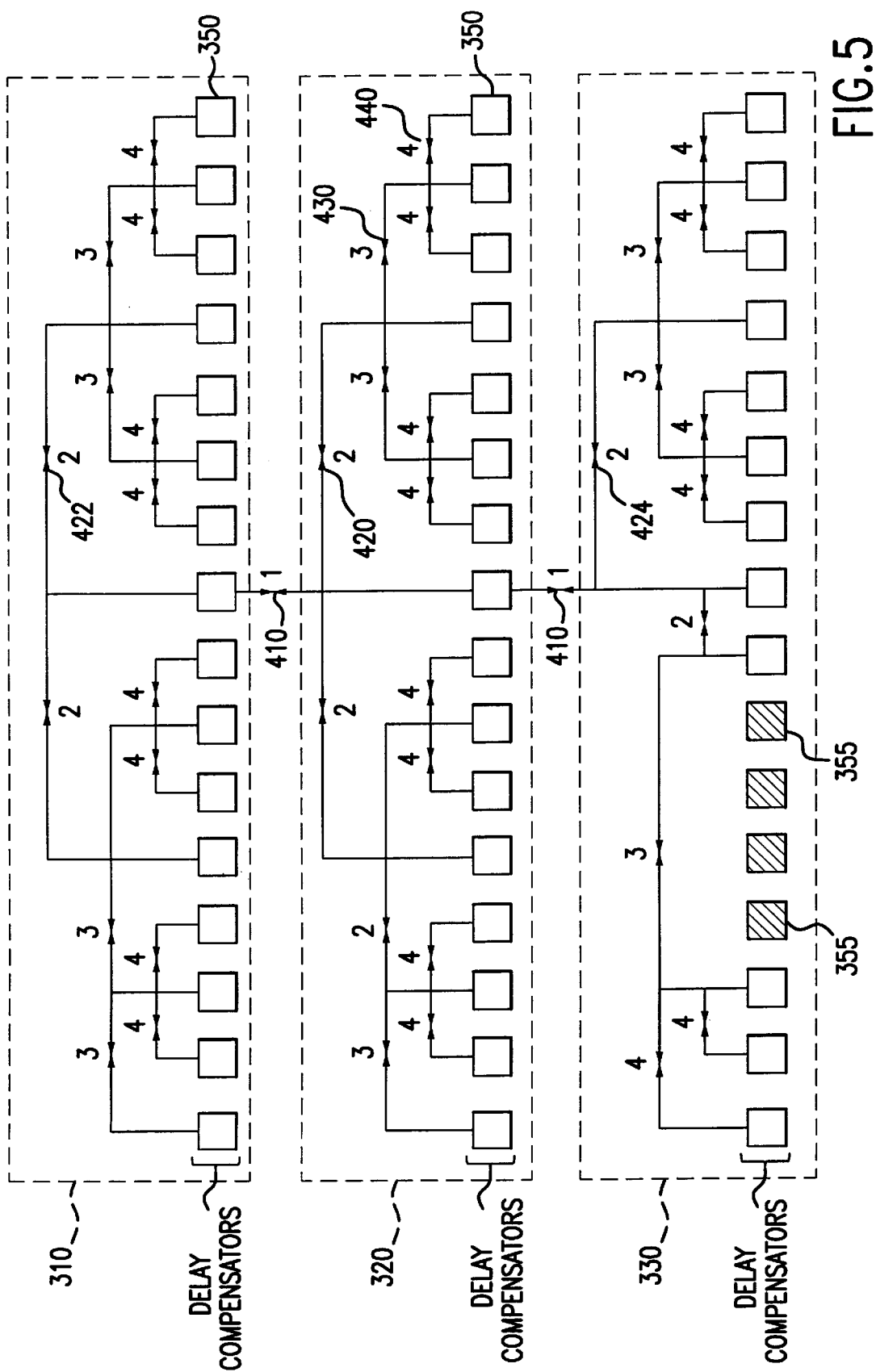
FIG. 5 is a global clock deskewing scheme according to an embodiment of the present invention.

FIG. 5 is a global clock deskewing scheme according to an embodiment of the present invention. The compensators 350 are again shown grouped into the top spine 310, the center spine 320 and the bottom spine 330. Note that some of the compensators, such as the shaded compensators 355, may be excluded from the deskewing plan, if desired. The arrows in FIG. 5, such as the arrows 410 representing the first step, represent a phase detector where associated clock input signals are compared. As used herein, the term phase detector means any device that may compare a number of clock signals.

Note that it would be possible to correct each global clock signal based on the nearest neighbor's clock until all of the delay compensators 350 have been programmed. This, however, would result in a large error between the original signal and the last compensator that was programmed. It would also be possible to separately compare each of the 48 signals to a single reference, but this would take a large amount of time. Moreover, the reference signal would be routed throughout the chip, which itself would lead to skewing errors and cause other problems in the design of the chip.

Accordingly, the scheme for performing global clock deskewing shown in FIG. 5 represents a compromise between these two approaches. At location 410, the global clock signal near the center point of the center spine 320 is used to correct the global clock signal near the center point of the other two spines 310, 330. To reduce the skew between the two signals, one of the signals is chosen to be the reference while the other is the signal to be aligned. The signal to be aligned is slowed down, or sped up, to bring it within a certain range of the reference signal. This process, which may be achieved using the programmable delay compensator 350, is labeled "1" in FIG. 5. These three signals may then be used to correct global clock signals halfway to both ends of each associated spine, which is the second step. For example, the global clock signal at the center of the top spine 310 is compared 422 with a signal at point halfway between the center and an end of that spine. Similar comparisons 420, 424 are made for the other two spines 320, 330. These points are selected because the clock skew error may be expected to be small at the center point of a spine and large at the end of a spine. The comparisons 430, 440 continue until all of the clock signals have been deskewed.

Figure 6:
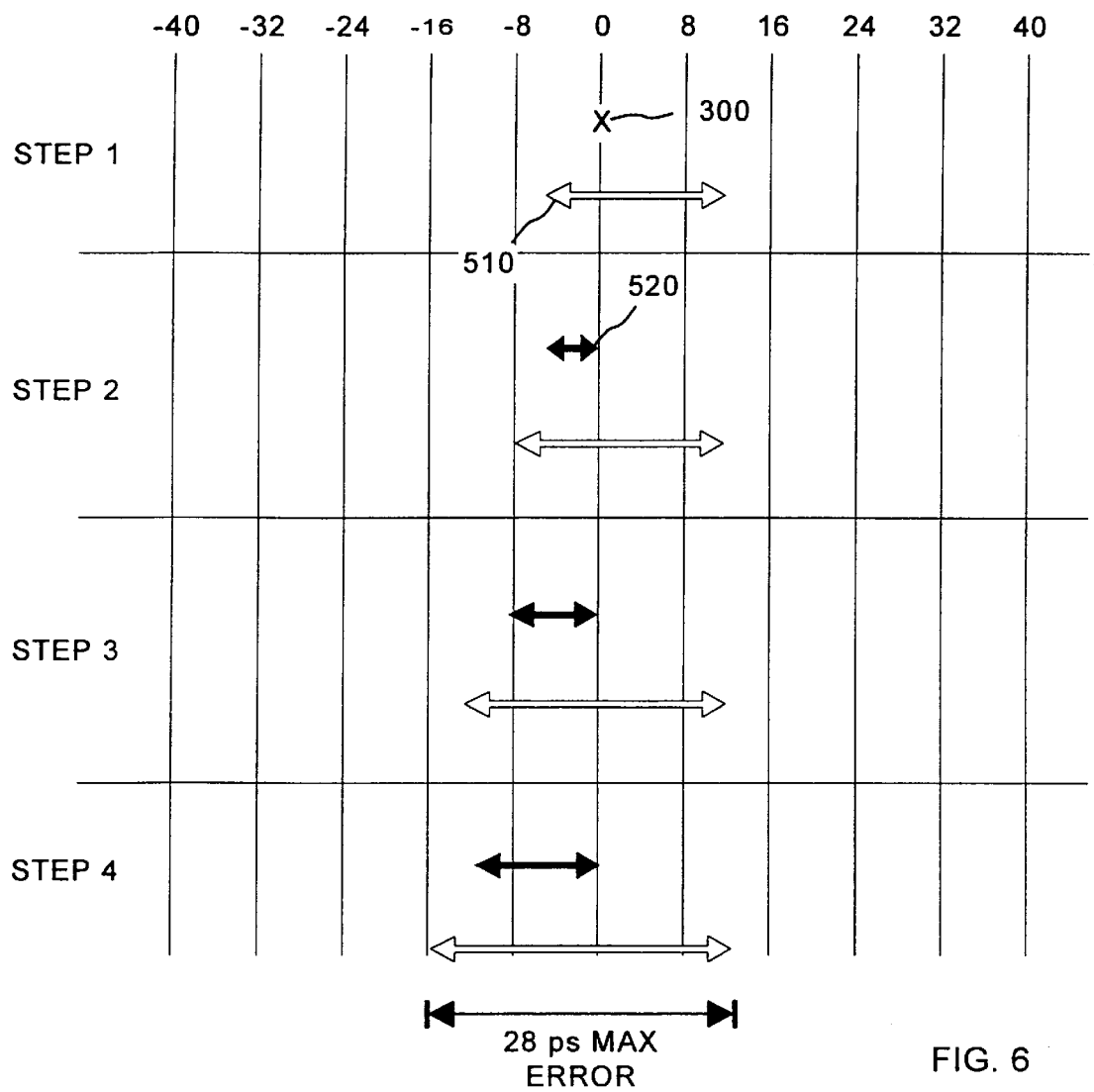
FIG. 6 illustrates the accumulated error of the global clock signal correction using the embodiment shown in FIG. 5.

FIG. 6 illustrates the error in the global clock signal correction that may accumulate as a result of the scheme shown in FIG. 5. The input reference signal 300 is shown on a relative time axis, in ps. A white arrow 510 represents the error that could be included in a signal being aligned in the first step. This signal is used as the reference for the second step, and the error that may be included in the second reference signal is shown as a black arrow 520. If the signal is slower than the reference, the two speedup bits D3, D4 (shown in FIG. 3) are asserted appropriately making the signal from 0–4 ps faster than the reference signal. This is done to reduce the error in the next step's reference signal. The error ranges for the signals in the other steps are likewise shown in FIG. 6. As can be seen, a 28 ps error between signals may accumulate after the scheme is completed.

Figure 7:
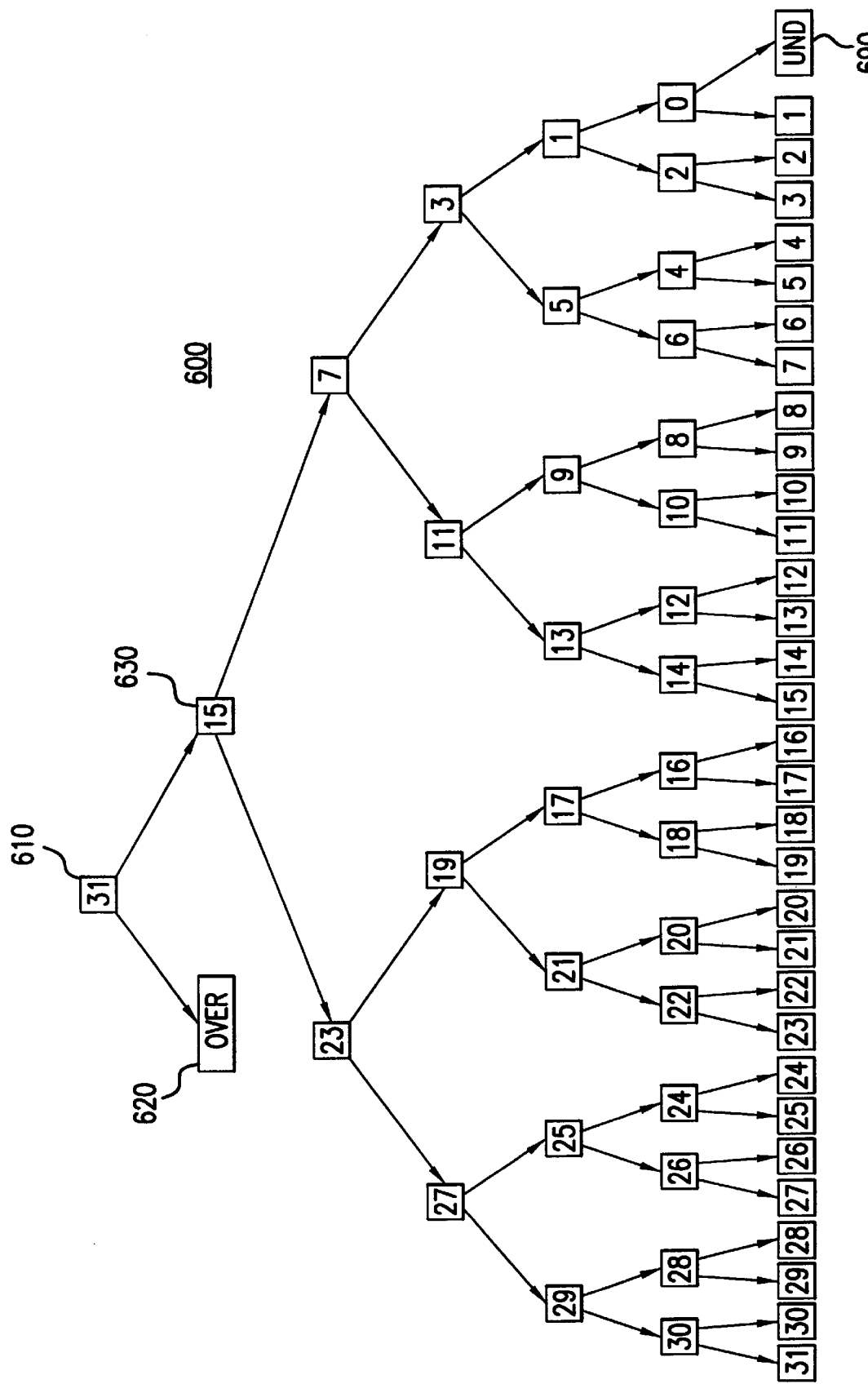
FIG. 7 is a method of determining a decimal value for deskew control bits according to an embodiment of the present invention.

FIG. 7 is a method of determining a decimal value for a programmable delay compensator's control bits according to an embodiment of the present invention. The boxes in the decision tree 600 contain the decimal value of the 5 control bits, which may range from 0 to 31. The approach begins at box 610 with a decimal value of 31. Throughout FIG. 7, an arrow pointing to the left of a box indicates that the phase detector decided the signal was slower than the reference. An arrow pointing to the right of a box indicates that the phase detector decided the signal was faster than the reference.

If at box 610 the phase detector decides that the signal is slower than the reference, the signal cannot be slowed down further because the control bits are already set to a large value. In this case, an "overflow" condition 620 exists and, in this embodiment, nothing more may be done to deskew the signal. If, however, the phase detector decides that the signal is faster than the reference, the skew may be reduced by setting the control bits to 15 at box 630. Similar decisions may be made until a final value for the control bits is determined. For example, as shown by the dotted arrows in FIG. 7, the control bits may be changed from 31 to 15 to 7 to 11 to 13 to 12. With each adjustment, the clock skew is being reduced by speeding up or slowing down the clock signal, in smaller and smaller increments, as appropriate.

Note that if the five control bits reach 0 and the signal is still faster than the reference, then an "underflow" condition 690 has been reached because the control bits are already at a small value. Nothing more is done to deskew the clock signal according to this embodiment.

Once the appropriate 5 bits are determined, the compensator may be permanently programmed if desired using fuses to deskew the global clock signal at the destination. Note that only 3 of the 5 control bits are fused in this embodiment.

Although various embodiments are specifically illustrated and described herein, it will be appreciated that modifications and variations of the present invention are covered by the above teachings and within the purview of the appended claims without departing from the spirit and intended scope of the invention. For example, a particular deskewing scheme was used to illustrate an embodiment of the present invention, it will be appreciated that other schemes will also fall within the scope of the invention. Similarly, although three fusible and two non-fusible control bits were disclosed, other numbers of fusible and non-fusible control bits could also be used. Moreover, although software or hardware are described to control certain functions, such functions may be performed using either software, hardware or a combination of software and hardware, as is well known in the art.

What is claimed is:

1. A method of compensating for skew in a distributed clock signal to a domain clock, comprising:

comparing the distributed clock signal at a first location in the processor with a reference clock signal;

determining delay control bits based on the results of said comparison said, delay control bits including fuse bits and non-fuse bits;

storing said delay control bits in a control register;

decoding said fuse bits;

programming a programmable delay compensator according to said fuse bits;

adjusting the distributed clock signal based on said delay compensator and said non-fuse bits.

2. The method of claim 1, wherein the reference clock signal is taken at a reference location at approximately the center of the processor, and the first location is approximately halfway between the reference location and an edge of the processor.

3. The method of claim 1, wherein the reference clock signal is taken at a reference location where the clock skew is expected to be near a minimum, and the first location is approximately halfway between the reference location and a location where the clock skew is expected to be near a maximum.

4. The method of claim 1, wherein said programming comprises:

programming said programmable delay compensator to adjust the distributed clock signal based on the results of said comparison.

5. The method of claim 4, wherein said programming comprises:

changing the number of pull down paths in a variable delay inverter within said programmable delay compensator associated with the distributed clock signal.

6. The method of claim 5, wherein said changing comprises:

modifying said control bits which change the number of pull down paths in the variable delay inverter.

7. The method of claim 6, further comprising:

storing a value for the control bits with a fuse, the value representing a number of pull down paths to correct the distributed clock signal based on the results of said comparison.

8. The method of claim 1, wherein said programming comprises:

programming a first variable delay inverter within said programmable delay compensator to correct the rising edge of the distributed clock signal based on the results of said comparison; and programming a second variable delay inverter within said programmable delay compensator to correct the falling edge of the distributed clock signal based on the results of said comparison.

9. The method of claim 1, further comprising:

comparing a second distributed clock signal at a second location in the processor with a reference clock signal; and adjusting the second distributed clock signal based on the results of said comparison with the reference clock signal.

10. The method of claim 1, further comprising:

comparing a second distributed clock signal at a second location in the processor with the adjusted distributed clock signal; and adjusting the second distributed clock signal based on the results of said comparison with the adjusted distributed clock signal.

11. The method of claim 10, wherein the second location is approximately halfway between the reference location and the first location.

12. The method of claim 10, wherein the second location is approximately halfway between the reference location and the edge of the processor.

13. An apparatus for compensating for skew in a distributed clock signal to a domain clock, comprising:

a programmable delay compensator having a clock signal input port, a corrected clock signal output port and a control signal input port;

a control unit having an output port coupled to the control signal input port, said control unit including a control register;

fuse and non-fuse bits stored in said control register;

a decoder within said control unit that is coupled to said control register to generate a control signal input according to said fuse bits; and a pull down path within said programmable delay compensator that programs said compensator in response to said control signal input such that said delay compensator and said non-fuse bits adjust said distributed clock signal.

14. The apparatus of claim 13, wherein said programmable delay buffer comprises:

said control signal input port being coupled to said pull down path.

15. The apparatus of claim 14, wherein said control register further comprises:

a fuse coupled to said control register.

16. A processor, comprising:

a clock generation unit generating a clock signal;

a global clock distribution network having a receiving end coupled to said clock generation unit and a destination end;

a control unit including a control register to store fuse and non-fuse bits and a decoder to decode said fuse bits to generate a control signal input;

a skew compensator at the destination end of said global clock distribution network coupled to said control unit to receive said control signal input and adjust said clock signal in conjunction with said non-fuse bits.

17. The processor of claim 16, further comprising:

a phase detector coupled to the destination end of said global clock distribution network and having as inputs the clock signal and a reference signal.

18. A computer readable medium having stored thereon instructions which, when executed by a first processor, cause the first processor to perform steps to compensate for skew in a distributed clock signal to a domain clock, comprising:

comparing the distributed clock signal at a first location in a second processor with a reference clock signal;

determining delay control bits based on the results of said comparison, said delay control bits including fuse bits and non-fuse bits;

storing said delay control bits in a control register;

decoding said fuse bits;

programming a programmable delay compensator according to said fuse bits;

adjusting the distributed clock signal based on said delay compensator and said non-fuse bits.

* * * * *